(12) United States Patent
Wang et al.

(10) Patent No.: US 12,219,798 B2
(45) Date of Patent: Feb. 4, 2025

(54) DISPLAY SUBSTRATE AND DISPLAY APPARATUS

(71) Applicant: BOE Technology Group Co., Ltd., Beijing (CN)

(72) Inventors: Tao Wang, Beijing (CN); Tao Sun, Beijing (CN); Yue Cui, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 715 days.

(21) Appl. No.: 17/480,055

(22) Filed: Sep. 20, 2021

(65) Prior Publication Data
US 2022/0231257 A1 Jul. 21, 2022

(30) Foreign Application Priority Data
Jan. 20, 2021 (CN) .......................... 202110074512.2

(51) Int. Cl.
*H10K 50/844* (2023.01)
*H10K 50/856* (2023.01)
*H10K 50/858* (2023.01)
*H10K 59/122* (2023.01)
*H10K 59/35* (2023.01)

(52) U.S. Cl.
CPC ......... *H10K 50/844* (2023.02); *H10K 50/856* (2023.02); *H10K 50/858* (2023.02); *H10K 59/122* (2023.02); *H10K 59/353* (2023.02)

(58) Field of Classification Search
CPC .. H10K 50/844; H10K 59/353; H10K 59/122; H10K 50/858; H10K 50/85
See application file for complete search history.

(56) References Cited

U.S. PATENT DOCUMENTS

| 2016/0268540 | A1* | 9/2016 | Kim ................... H10K 50/8445 |
| 2018/0061722 | A1 | 3/2018 | Byun et al. |
| 2018/0102502 | A1 | 4/2018 | Kim et al. |
| 2018/0226483 | A1 | 8/2018 | Kim et al. |

(Continued)

FOREIGN PATENT DOCUMENTS

| CN | 106252379 A | 12/2016 |
| CN | 107808930 A | 3/2018 |

(Continued)

OTHER PUBLICATIONS

CN202110074512.2 first office action.

*Primary Examiner* — Monica D Harrison
*Assistant Examiner* — Andre C Stevenson
(74) *Attorney, Agent, or Firm* — IPro, PLLC

(57) ABSTRACT

Disclosed are a display substrate and a display apparatus. The display substrate includes: a base substrate, including a display region and a non-display region; an encapsulation dam, disposed on the base substrate and located in the non-display region, and annularly surrounding the display region; and an overflow detection structure, disposed on the base substrate and located in the non-display region, and annularly surrounding the display region, where the overflow detection structure is located between a region where the encapsulation dam is located and the display region. The overflow detection structure includes: at least one convex part; and a reflection part on a side, facing away from the base substrate, of the convex part and at least partially covering the at least one convex part.

20 Claims, 6 Drawing Sheets

(56) References Cited

U.S. PATENT DOCUMENTS

2018/0254431 A1* 9/2018 Kim .................. H10K 50/84
2020/0243401 A1    7/2020 Wang et al.
2021/0376289 A1* 12/2021 Lu .................... H10K 71/00

FOREIGN PATENT DOCUMENTS

| CN | 107919293 A | 4/2018 |
| CN | 108598282 A | 9/2018 |
| CN | 209328948 U | 8/2019 |

* cited by examiner

DISPLAY SUBSTRATE AND DISPLAY APPARATUS

CROSS REFERENCE TO RELATED APPLICATIONS

This disclosure is based on and claims priority under 35 U.S.C 119 to Chinese Patent Application No. 202110074512.2, filed on Jan. 20, 2021, in the China National Intellectual Property Administration. The entire disclosure of the above application is incorporated herein by reference.

FIELD

The present disclosure relates to the field of display technology, in particular to a display substrate and a display apparatus.

BACKGROUND

An organic light-emitting diode (OLED) display apparatus includes a display screen based on an organic light-emitting diode and has excellent characteristics such as self-illumination, high contrast, low thickness, wide viewing angle, high response speed, capability of being used for a flexible panel, wide operating temperature range, simple structure and manufacturing process, etc., thereby attracting more and more attention and having broad application prospects.

Components such as water vapor and oxygen in the air have a great influence on the life of an OLED device in the OLED display apparatus. This is because electrons need to be injected from a cathode during operation of the OLED device, which requires a cathode work function to be as low as possible. However, the cathode is usually made of metal materials such as aluminum, magnesium, calcium, etc., the chemical properties of which are relatively active. As such, the cathode is likely to react with the infiltrating water vapor and oxygen. In addition, water vapor and oxygen are also likely to chemically react with a hole transport layer and an electron transport layer of the OLED device, which will cause the failure of the OLED device. Therefore, effective encapsulation of the OLED device is required to sufficiently separate functional layers of the OLED device from the water vapor, oxygen and other components in the atmosphere, to allow prolong the life of the OLED device, thereby prolonging the service life of the OLED display apparatus.

SUMMARY

Embodiments of the present disclosure provide a display substrate and a display apparatus.

In one aspect, some embodiments of the disclosure provide a display substrate. The display substrate includes: a base substrate, including a display region and a non-display region; an encapsulation dam, disposed on the base substrate and located in the non-display region, and annularly surrounding the display region; and an overflow detection structure, disposed on the base substrate and located in the non-display region, and annularly surrounding the display region, where the overflow detection structure is located between a region where the encapsulation dam is located and the display region. The overflow detection structure includes: at least one convex part; and a reflection part on a side, facing away from the base substrate, of the convex part and at least partially covering the at least one convex part.

In another aspect, some embodiments of the present disclosure provide a display apparatus including a display substrate. The display substrate includes: a base substrate, including a display region and a non-display region; an encapsulation dam, disposed on the base substrate and located in the non-display region, and annularly surrounding the display region; and an overflow detection structure, disposed on the base substrate and located in the non-display region, and annularly surrounding the display region, where the overflow detection structure is located between a region where the encapsulation dam is located and the display region. The overflow detection structure includes: at least one convex part; and a reflection part on a side, facing away from the base substrate, of the convex part and at least partially covering the at least one convex part.

DETAILED DESCRIPTION

Figure 1:
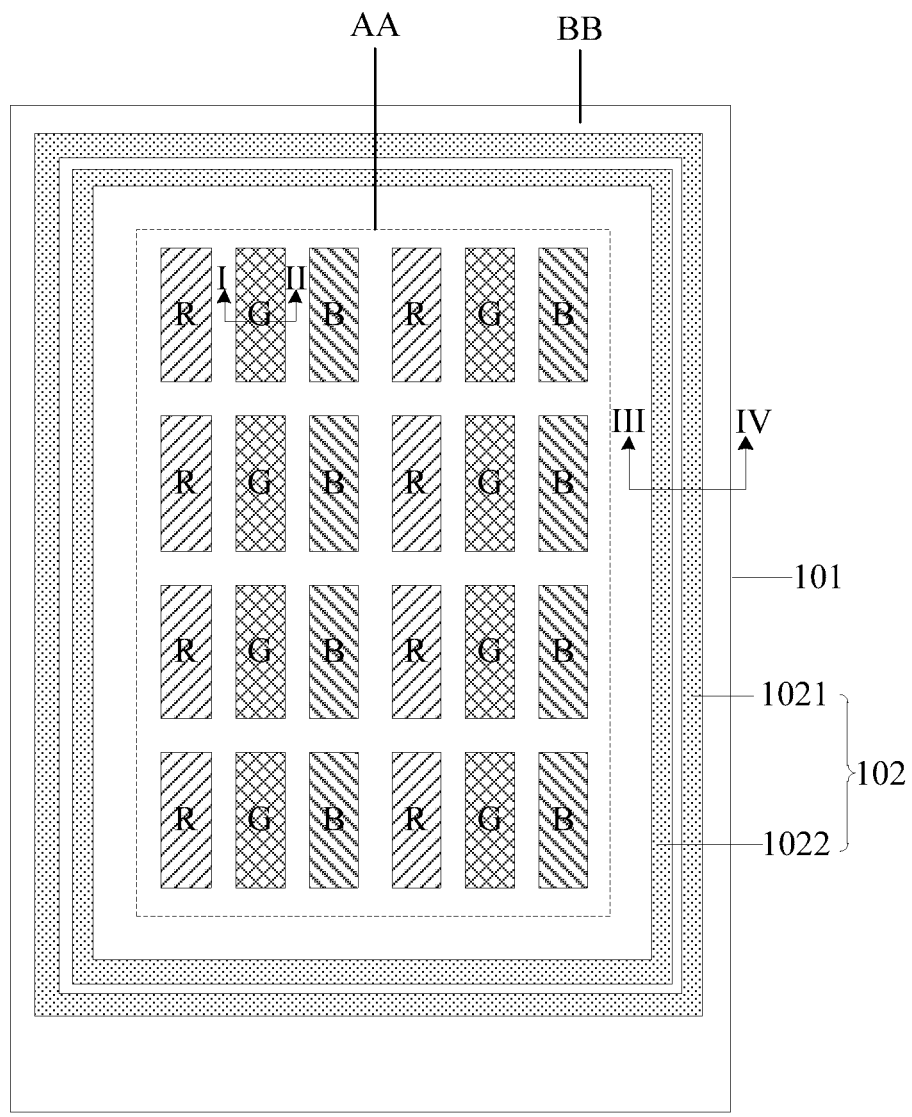
FIG. 1 is a schematic structural diagram of a display substrate according to some embodiments of the present disclosure.

In order to make objectives, technical solutions, and advantages of embodiments of the present disclosure clearer, the technical solutions of the embodiments of the present disclosure will be described clearly and completely with reference to accompanying drawings of the embodiments of the present disclosure. It should be noted that the dimensions and shapes of various figures in the drawings do not reflect a true scale and are only intended to illustrate contents of the present disclosure. Meanwhile, same or similar reference numerals refer to same or similar elements or elements having same or similar functions throughout. Apparently, the described embodiments are merely some, but not all embodiments of the present disclosure. Based on the described embodiments of the present disclosure, all other embodiments obtained by those ordinarily skilled in the art without any inventive effort are within the protection scope of the present disclosure.

Unless defined otherwise, technical or scientific terms used in the present disclosure shall have common meaning as understood by those ordinary skilled in the art to which the present disclosure belongs. "First", "second", and similar words used in the specification and claims of the present disclosure do not denote any order, quantity, or importance, but are solely used to distinguish one from another. "Include" or "comprise", and the like mean that elements or items that precede the word cover the elements or items listed after the word and equivalents thereof, but do not exclude other elements or items. The terms "Inner", "Outer", "Upper", "Lower", and the like are used merely to denote a relative positional relationship that may change accordingly when the absolute position of an object being described changes.

In order to keep the following descriptions of the embodiments of the present disclosure clear and concise, the present disclosure omits detailed descriptions of known functions and known components.

In related technologies, a thin film encapsulation (TFE) technology is generally adopted to encapsulate the OLED device. Specifically, a thin film encapsulation structure includes two inorganic layers and an organic layer between the two inorganic layers. At present, the organic layer is generally prepared by screen printing or inkjet printing. However, neither of the above two methods can block the overflow of the organic materials in the process of coating to curing due to characteristics of organic materials. In the thin film encapsulation structure, the coverage region of the organic layer is smaller than that of the inorganic layers, that is, the organic layer is wrapped by the inorganic layers. As such, if overflow occurs, the actual encapsulation reliability of the thin film encapsulation structure will be affected.

Figure 2:
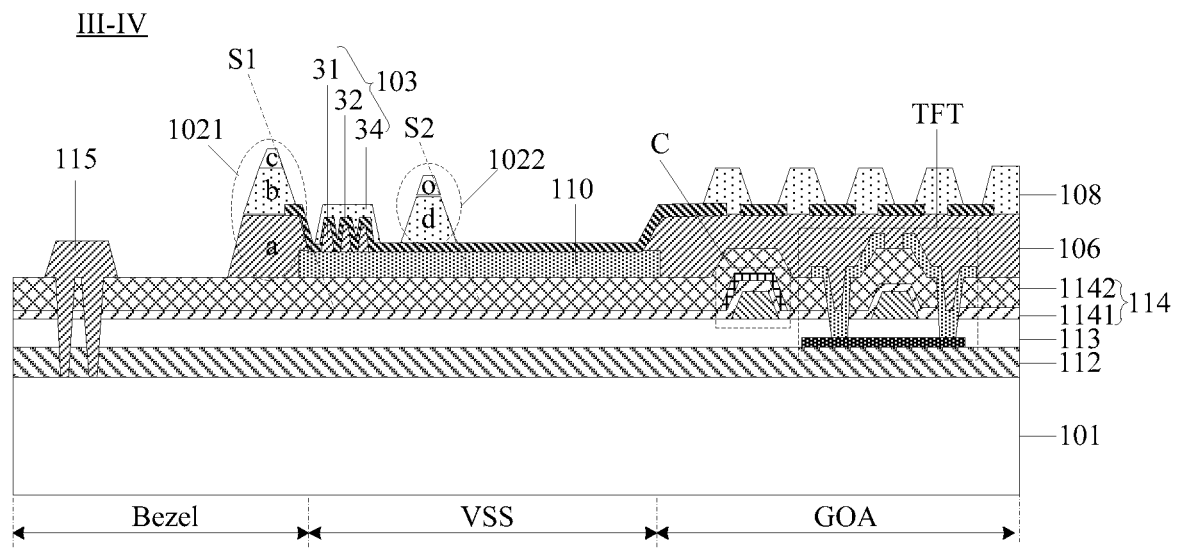
FIG. 2 illustrates a cross-sectional view of the display substrate along a line III-IV in FIG. 1.

A display substrate provided by embodiments of the present disclosure, as shown in FIG. 1 and FIG. 2, include:

a base substrate 101, including a display region AA and a non-display region BB. In some embodiments, the base substrate 101 may be a flexible base substrate or a rigid base substrate;

an encapsulation dam 102, in the non-display region BB of the base substrate 101 and annularly surrounding the display region AA; and an overflow detection structure 103, in the non-display region BB of the base substrate 101, annularly surrounding the display region AA, and located between a region where the encapsulation dam 102 is located and the display region AA; wherein the overflow detection structure 103 includes at least one convex part 31 and a reflection part 32 on one side, facing away from the base substrate 101, of the convex part 31 and at least partially covering the at least one convex part 31.

Figure 3:
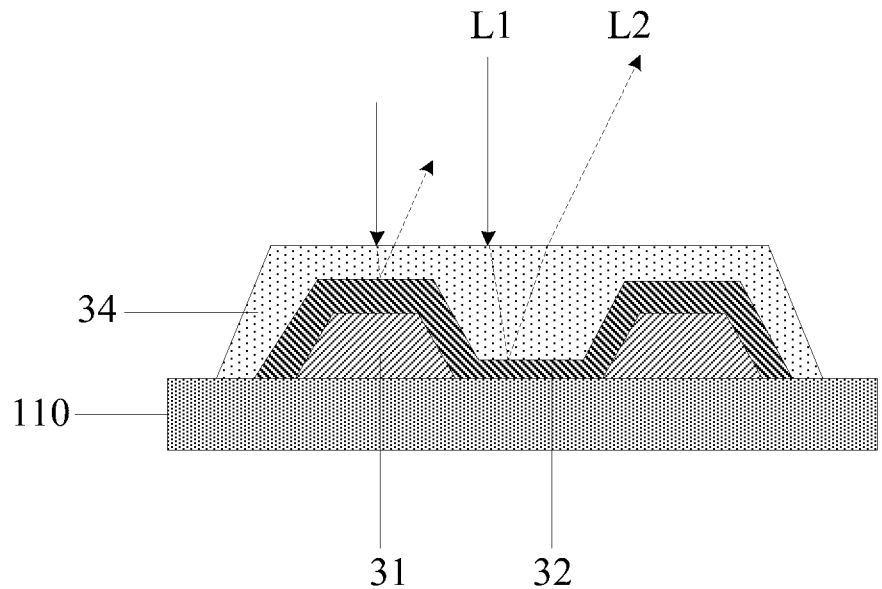
FIG. 3 illustrates a light path diagram when an organic encapsulation layer does not overflow according to some embodiments of the present disclosure.
Figure 4:
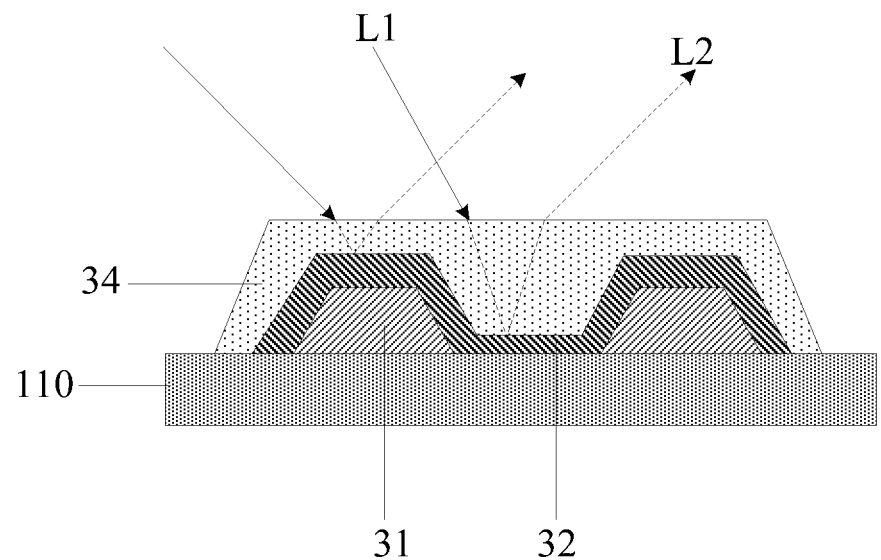
FIG. 4 illustrates another light path diagram when an organic encapsulation layer does not overflow according to some embodiments of the present disclosure.
Figure 5:
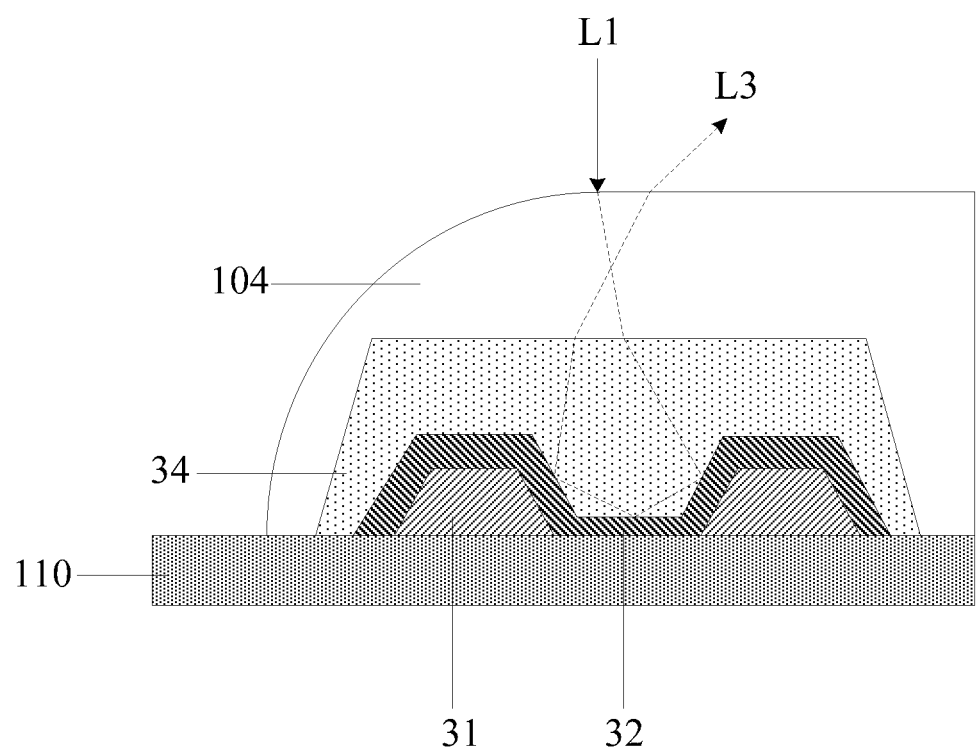
FIG. 5 illustrates a light path diagram when an organic encapsulation layer overflows according to some embodiments of the present disclosure.

In the above-mentioned display substrate provided by the present disclosure, as shown in FIG. 3 and FIG. 4, when no overflow occurs in an organic encapsulation layer 104 formed subsequently, a detection light ray L1 is reflected by the by the reflection part 32, and a first reflected light ray L2 has a first deflection angle relative to the detection light ray L1. As shown in FIG. 5, when the organic encapsulation layer 104 overflows to the overflow detection structure, based on a refractive index difference between the organic encapsulation layer 104 and the reflection part 32, the detection light ray L1 is refracted by the organic encapsulation layer 104 and then reflected by the reflection part 32, a second reflected light ray L3 has a second deflection angle relative to the detection light ray L1. As such, the present disclosure can detect whether the organic encapsulation layer 104 overflows. In addition, since the reflection part 32 at least partially covers the at least one the convex part 31, the reflection part 32 has an uneven surface. Accordingly, a reflection area of the detection light ray L1 is effectively increased, and the detection light ray L1 is reflected on the reflection part 32 multiple times, so that the second reflected light ray L3 greatly deflects relative to the first reflected light ray L2, which helps the overflow detection of the organic encapsulation layer 104. In addition, the overflow detection structure 103 may limit outflow of the organic encapsulation layer 104 to a certain extent.

In some embodiments, a material of the organic encapsulation layer 104 may be a high-molecular material containing a desiccant or a high-molecular material that can block water vapor, or the like.

In some embodiments, in the above-mentioned display substrate provided by the embodiments of the present disclosure, as shown in FIG. 2, in order to improve the overflow detection efficiency of the organic encapsulation layer 104, the overflow detection structure 103 may include at least two convex parts 31 annularly arranged, and the reflection part 32 further at least fills a gap between the convex parts 31. In some embodiments, the reflection part 32 is conformally disposed on the convex parts 31, that is, fully covering the gap between the convex parts 31.

Figure 6:
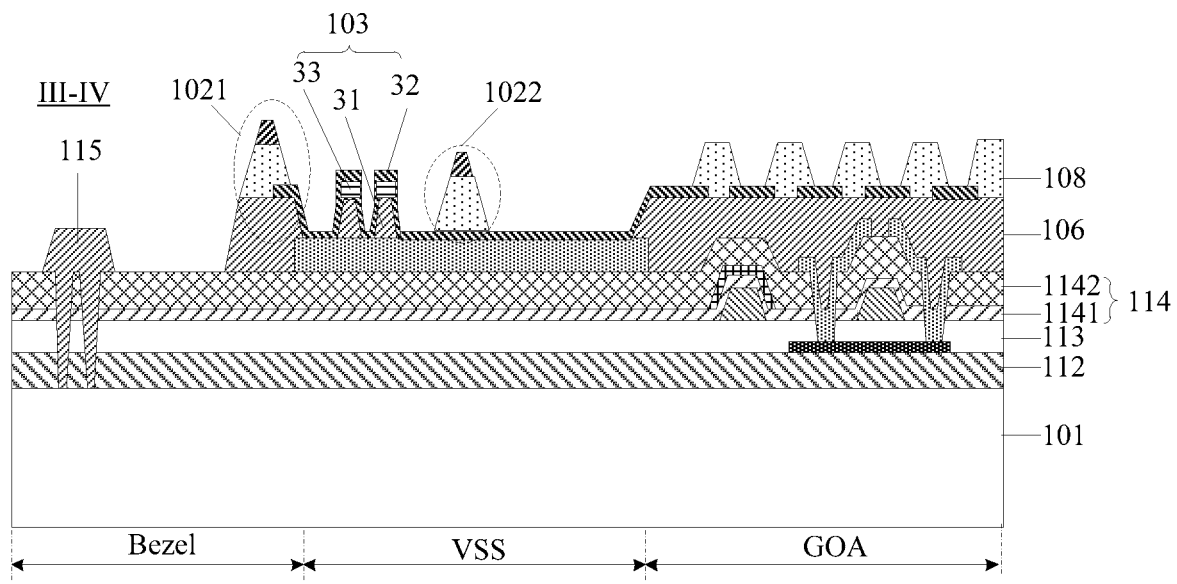
FIG. 6 is another cross-sectional view of the display substrate along a line III-IV in FIG. 1.

In some embodiments, in the above-mentioned display substrate provided by the embodiments of the present disclosure, as shown in FIG. 6, in order to increase adhesive force between the convex parts 31 and the reflection part 32, a protection part 33 is also arranged between each convex part 31 and the reflection part 32. An orthographic projection of each protection part 33 on the base substrate 101 fully covers an orthographic projection of the corresponding convex part 31 on the base substrate 101.

In some embodiments, a material of the convex parts 31 may be an organic insulating material such as polyimide, polyphthalimide, polyamide, acrylic resin, benzocyclobutene, or phenolic resin. A material of the protection parts 33 may be a dielectric material such as silicon oxide, silicon nitride, or silicon oxynitride. By covering the convex parts 31 with the protection parts 33, etching selection ratios of the organic material used for the convex parts 31 and an inorganic material used for the protection parts 33 are different, so that the convex parts 31 and the protection parts 33 form an undercut structure. In some embodiments, a convex part 31 and the protection part 33 may also form a "T"-shaped structure, which is not limited herein.

In some embodiments, in the above-mentioned display substrate provided by the embodiments of the present disclosure, as shown in FIG. 2, the overflow detection structure 103 may further include: a refraction part 34 on the reflection part 32. An orthographic projection of the refraction part 34 on the base substrate 101 fully covers the orthographic projection of the at least one convex part 31 on the base substrate 101.

In some embodiments, the refraction part 34 fully covers the at least two convex parts 31. In some embodiments, the refraction part 34 fully covers all the convex parts 31. The coating of the refraction part 34 increases a refraction path of the detection light ray L1, deepens the deflection of a light path, and even changes a direction, and further improves the overflow detection efficiency of the organic encapsulation layer 104.

Figure 7:
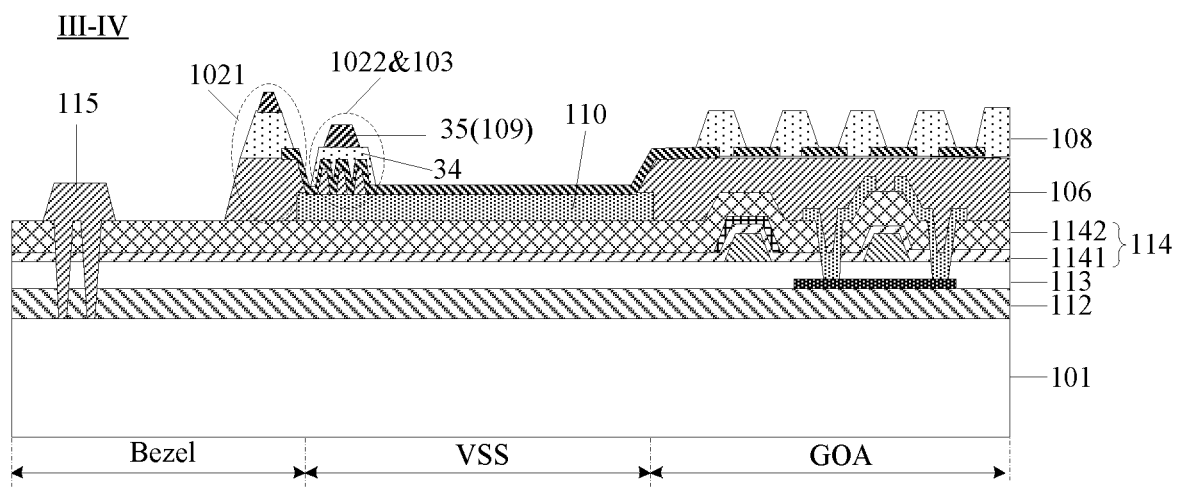
FIG. 7 is yet another cross-sectional view of the display substrate along a line III-IV in FIG. 1.

In some embodiments, in the above-mentioned display substrate provided by the embodiments of the present disclosure, as shown in FIG. 7, the overflow detection structure 103 may further include: a blocking dam 35 on the refraction part 34. An orthographic projection of the blocking dam 35 on the base substrate 101 is located within the orthographic projection of the refraction part 34 on the base substrate 101.

A height of the overflow detection structure 103 increases due to the arrangement of the blocking dam 35, thereby effectively restricting the outflow of the organic encapsulation layer 104 to a certain extent.

In some embodiments, in the above-mentioned display substrate provided by the embodiments of the present disclosure, as shown in FIG. 1 and FIG. 2, the encapsulation dam 102 may include a first encapsulation dam 1021 and a second encapsulation dam 1022. The first encapsulation dam 1021 surrounds the second encapsulation dam 1022, the first encapsulation dam 1021 has a first side S1 facing to the second encapsulation dam 1022, and the second encapsulation dam 1022 has a second side S2 facing away from the first encapsulation dam 1021.

In some embodiments, the first encapsulation dam 1021 and/or the second encapsulation dam 1022 may be a closed ring or a non-closed ring. For example, a plurality of segments may be included, and at least some segments partially overlap along the surrounding direction. In some embodiments, the closed or non-closed ring may have partial branches.

Figure 8:
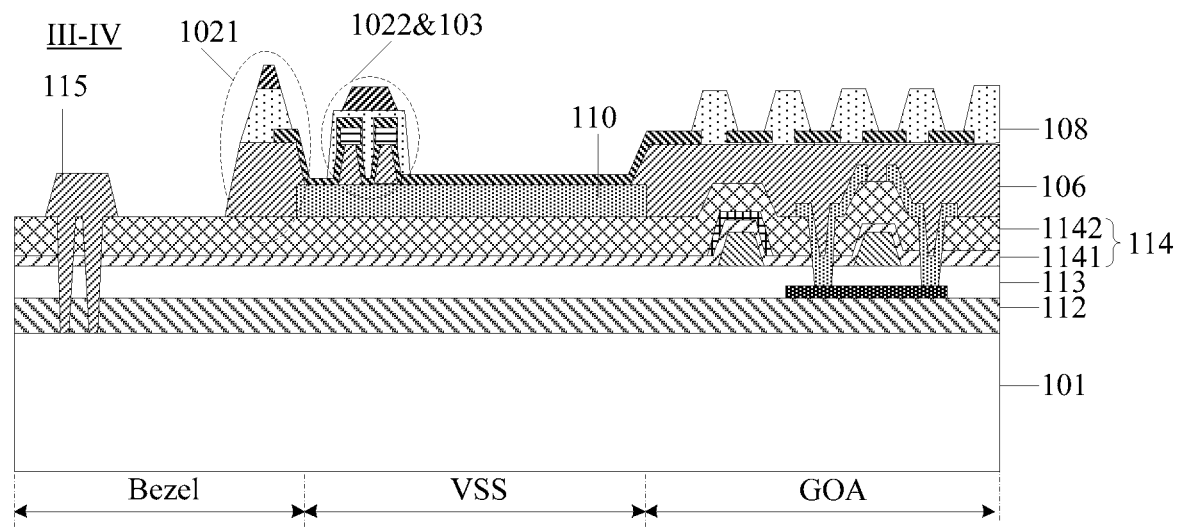
FIG. 8 is yet another cross-sectional view of the display substrate along a line III-IV in FIG. 1.
Figure 9:
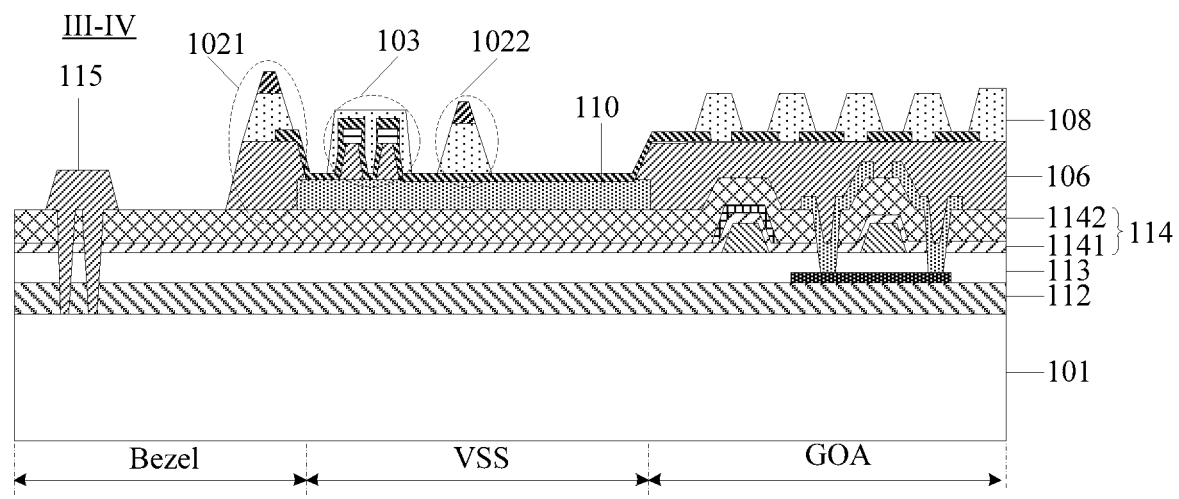
FIG. 9 is yet another cross-sectional view of the display substrate along a line III-IV in FIG. 1.

The overflow detection structure 103 may be located between the first side S1 and the second side S2. In some embodiments, as shown in FIG. 7 and FIG. 8, when the overflow detection structure 103 includes the blocking dam 35, the overflow detection structure 103 may be reused as the second encapsulation dam 1022. In other embodiments, as shown in FIG. 2, FIG. 6 and FIG. 9, the overflow detection structure 103 may be located between the first encapsulation dam 1021 and the second encapsulation dam 1022.

In some embodiments, the overflow detection structure 103 may be located between the first side of the first encapsulation dam 1021 and a side of the second encapsulation dam 1022 facing to the first encapsulation dam 1021.

Figure 10:
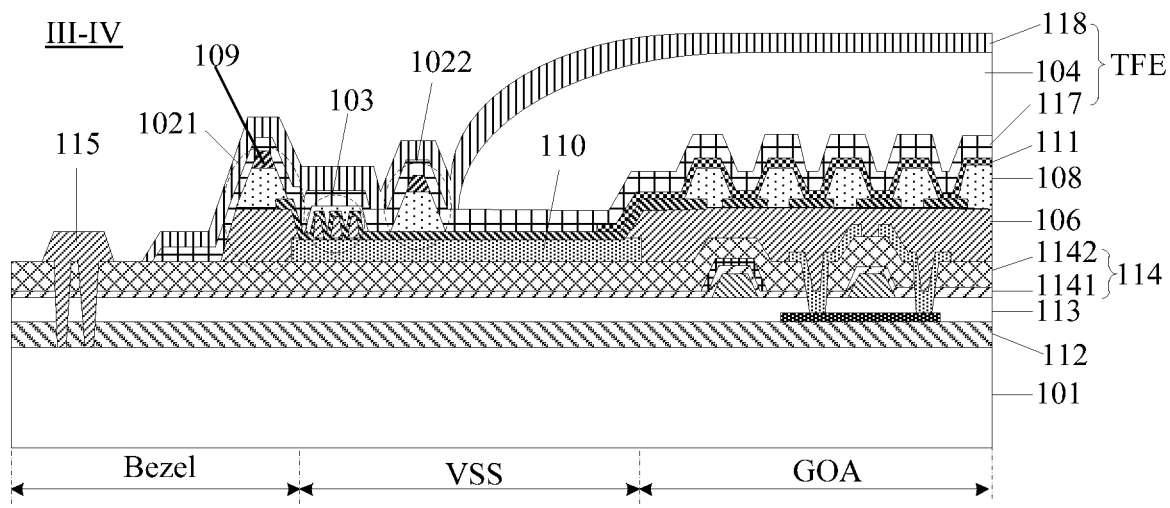
FIG. 10 is yet another cross-sectional view of the display substrate along a line III-IV in FIG. 1.
Figure 11:
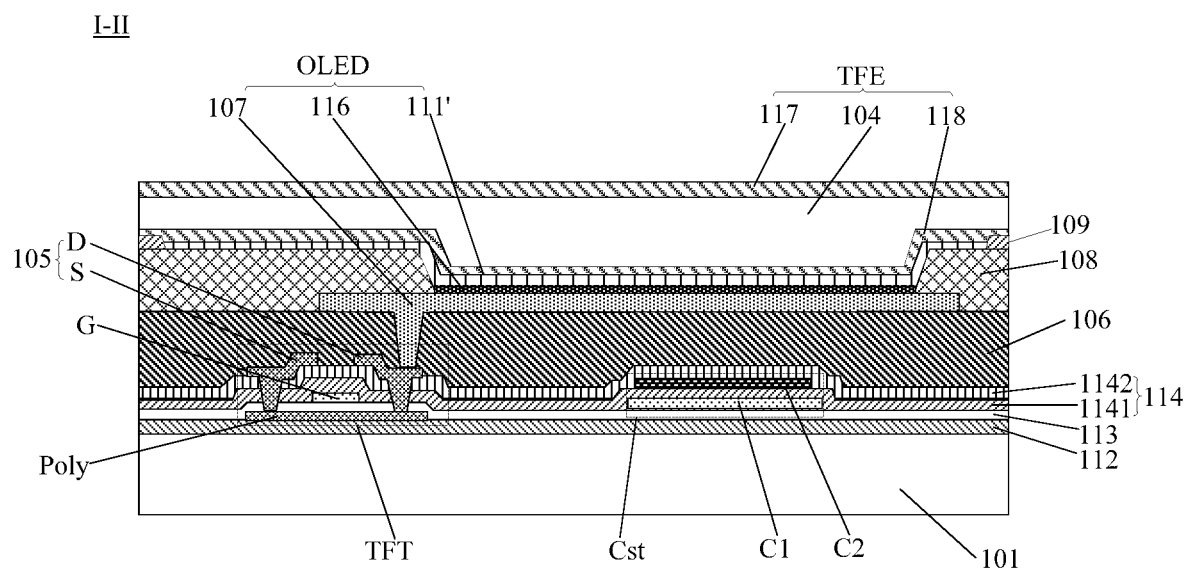
FIG. 11 is a cross-sectional view of the display substrate along a line I-II in FIG. 1.

In some embodiments, in the above-mentioned display substrate provided by the embodiments of the present disclosure, as shown in FIG. 10 and FIG. 11, the display substrate may further include: a source-drain metal layer 105 disposed between a layer where the first encapsulation dam 1021 is located and the base substrate 101, a planarization layer 106, an anode layer 107, a pixel defining layer 108 and a spacer layer 109 which are disposed on one side, facing away from the base substrate 101, of the source-drain metal layer 105, and a cathode line 111 on the same layer as a cathode layer 111'.

In some embodiments, the first encapsulation dam 1021 may include: a first encapsulation part a in the planarization layer 106, a second encapsulation part b in the pixel defining layer 108, and a third encapsulation part c in the spacer layer 109. The second encapsulation dam 1022 may include a fourth encapsulation part d in the pixel defining layer 108 and a fifth encapsulation part o in the spacer layer 109. The convex part 31 is disposed in the planarization layer 106, the reflection part 32 is disposed in the anode layer 107. One end of the reflection part 32 extends to that between the first encapsulation part a and the second encapsulation part b, and the other end of the reflection part 32 extends along a direction of ascending distance from the first encapsulation dam 1021. The blocking dam 35 is disposed in the spacer layer 109, and the refraction part 34 is disposed in the pixel defining layer 108. The source-drain metal layer 105 may include a low-level signal line 110, one end of the low-level signal line 110 is covered with the first encapsulation part a, and the other end of the low-level signal line 105 is electrically connected with the reflection part 32. The cathode line 111 is electrically connected with the reflection part 32.

The low-level signal line 110, the reflection part 32 and the cathode line 111 are used as trace structures to be configured to transmit electrical signals provided by a control chip disposed in a peripheral region to an OLED light-emitting device disposed in the display region AA. By adopting the above-mentioned embodiment solutions of the present disclosure, the low-level signal line (VSS) 110, the reflection part 32 and the cathode line 111 do not need to be fabricated by a patterning process, thereby simplifying the manufacturing process and saving the manufacturing cost.

In addition, the first encapsulation part a covers one end of the low-level signal line 110, and the second encapsulation part b covers one end of the reflection part 32, which can also protect the low-level signal line 110 and the reflection part 32, thus water vapor, oxygen and the like are prevented from corroding the low-level signal line 110 and the reflection part 32. Moreover, since the overflow detection structure 103 is located at one end of the low-level signal line 110, influence of the overflow detection structure 103 on signals transmitted by the low-level signal line 110 is small.

In some embodiments, as shown in FIG. 2, the display substrate may include a gate driving circuit GOA (which may include a transistor TFT and a capacitor C) at an inner side (that is, a side away from the first encapsulation dam 1021) of the second encapsulation dam 1022, and the other end of the low-level signal line 110, that is the end other than that with the overflow detection structure 103, may extend to an edge, close to the second encapsulation dam 1022, of the gate driving circuit GOA. That is, the low-level signal line 110 may be disposed in a region between the first encapsulation dam 1021 and the gate driving circuit GOA.

In the embodiment of the present disclosure, both the first encapsulation dam 1021 and the second encapsulation dam 1022 may limit the overflow of the organic encapsulation layer 104 manufactured subsequently. Moreover, since the second encapsulation dam 1022 does not have the planarization layer 106 than the first encapsulation dam 1021, a height of the second encapsulation dam 1022 relative to the base substrate 101 is lower than a height of the first encapsulation dam 1021 relative to the base substrate 101. In this way, a path for external water vapor and oxygen to enter the display region AA becomes longer, and the difficulty of entering the display region AA is increased.

In some embodiments, a material of the source-drain metal layer 105 may be molybdenum, aluminum, silver, copper, titanium, platinum, tungsten, tantalum, tantalum nitride, alloys and combinations thereof, or other suitable materials; and the source-drain metal layer 105 may be a single layer or multiple layers made of metal, for example a molybdenum metal layer/aluminum metal layer/molybdenum metal layer or a titanium metal layer/aluminum metal layer/titanium metal layer. A material of the planarization layer 106 may be organic insulating materials such as polyacrylic resin, polyepoxy acrylic resin, photosensitive polyimide resin, polyester acrylate, urethane acrylate resin, and novolac epoxy acrylic resin, which is not limited herein. A material of the pixel defining layer 108 and a material of the spacer layer 109 may be organic materials, for example, may include organic insulating materials such as polyimide, polyphthalimide, polyamide, acrylic resin, benzocyclobutene, and phenolic resin. A material of the anode layer 107 may include metals and metal oxides (such as indium tin oxide, and indium zinc oxide). For example, a structure of the anode layer 107 is a stacked structure formed by indium tin oxide/silver/indium tin oxide, or aluminum/indium tin oxide. A material of the cathode line 111 may be magnesium, silver, calcium, aluminum, manganese oxide, and indium tin oxide.

In some embodiments, in the above-mentioned display substrate provided by the embodiments of the present disclosure, as shown in FIG. 2, FIG. 6 to FIG. 9, in order to prevent cracks caused by cutting etc. from extending to the first encapsulation dam 1021 which may affect the encapsulation effect, the display substrate may further include: a buffer layer 112, a gate insulating layer 113, and an interlayer dielectric layer 114 which are sequentially disposed on the side, facing the source-drain metal layer 105, of the base substrate 101.

In some embodiments, the planarization layer 106 further includes: a crack barrier dam 115 surrounding the first encapsulation dam 1021, and part of the crack barrier dam 115 is at least embedded in at least one of the buffer layer 112, the gate insulating layer 113 or the interlayer dielectric layer 114.

In some embodiments, as shown in FIG. 2 and FIGS. 6-9, the crack barrier dam 115 may be located at a peripheral region (Bezel) of an outer side (that is, a side away from the second encapsulation dam 1022) of the first encapsulation dam 1021, and part of the crack barrier dam 115 is embedded in the buffer layer 112, the gate insulating layer 113 and the interlayer dielectric layer 114, so that the adhesive force of the crack barrier dam 115 is significantly increased and the crack barrier dam 115 is effectively prevented from falling off.

In some embodiments, the buffer layer 112 may prevent or reduce the diffusion of metal atoms and/or impurities from the base substrate 101 into an active layer. In some embodiments, the buffer layer 112 may include an inorganic material such as silicon oxide, silicon nitride, and/or silicon oxynitride, and may be formed as multiple layers or a single layer. The gate insulating layer 113 may include, for example, a silicon compound, and metal oxides, for example, silicon oxynitride, silicon oxide, silicon nitride, silicon oxycarbide, silicon carbide nitride, aluminum oxide, aluminum nitride, tantalum oxide, hafnium oxide, zirconium oxide, and titanium oxide. The gate insulating layer 113 may be formed as a single layer or multiple layers. A material of the interlayer dielectric layer 114 may be lead oxide, tantalum pentoxide, zirconium dioxide, aluminum oxide, silicon nitride, silicon oxide, and silicon oxynitride. In addition, as shown in FIG. 2, the interlayer dielectric layer 114 may include a first interlayer dielectric layer 1141 and a second interlayer dielectric layer 1142.

Generally, in the above-mentioned display substrate provided by the embodiments of the present disclosure, as shown in FIG. 11, the display substrate may further include an OLED light-emitting device, a pixel driving circuit (including a transistor TFT and a storage capacitor Cst), and an encapsulation layer TFE. The OLED light-emitting device may include a light-emitting function layer 116 located between the anode layer 107 and the cathode layer 111'. In some embodiments, the light-emitting function layer 116 may include, but is not limited to, a hole injection layer, a hole transport layer, an electron blocking layer, a light-emitting material layer, a hole blocking layer, an electron transport layer and an electron injection layer. A material of the light-emitting material layer may include small molecular organic materials or polymer molecular organic materials, which may be fluorescent light-emitting materials or phosphorescent light-emitting materials, and may emit red light, green light, blue light, or white light. The transistor TFT may include an active layer Poly, a gate G, a source S, and a drain D; and the storage capacitor Cst may include a first electrode C1 and a second electrode C2. The encapsulation layer TFE may further include a first inorganic encapsulation layer 117 and a second inorganic encapsulation layer 118. In some embodiments, materials of the first inorganic encapsulation layer 117 and the second inorganic encapsulation layer 118 may include insulating materials such as silicon oxynitride, silicon oxide, silicon nitride, and high-molecular resin; and inorganic materials such as silicon oxynitride, silicon oxide, and silicon nitride are highly dense and can effectively prevent the intrusion of water vapor and oxygen.

Based on the same inventive concept, an embodiment of the present disclosure further provides a display apparatus, including the above-mentioned display substrate provided by the embodiments of the present disclosure. The display apparatus may be any product or component with a display function, such as a mobile phone, a tablet computer, a television, a display, a notebook computer, a digital photo frame, a navigator, a smart watch, a fitness wristband, and a personal digital assistant. Other essential components of the display apparatus will be apparent to those ordinarily skilled in the art and will not be described in detail herein, nor supposed to limit the present disclosure. In addition, since a principle of solving the problem of the display apparatus is similar to a principle of solving the problem of the above-mentioned display substrate, the implementation of the display apparatus may refer to the above-mentioned embodiments of the display substrate, and repetitive parts will not be repeated.

It is apparent to those skilled in the art that various modifications and variations can be made in the present disclosure without departing from the spirit or scope of the present disclosure. In this case, if these modifications and variations of the present disclosure fall within the scope of claims and their equivalents, the present disclosure also intends to include these modifications and variations.

What is claimed is:

1. A display substrate, comprising:
   a base substrate, comprising a display region and a non-display region;
   an encapsulation dam, disposed on the base substrate and located in the non-display region, and annularly surrounding the display region; and
   an overflow detection structure, disposed on the base substrate and located in the non-display region, and annularly surrounding the display region, wherein the overflow detection structure is located between a region where the encapsulation dam is located and the display region;
   wherein the overflow detection structure comprises:
   at least one convex part; and
   a reflection part on a side, facing away from the base substrate, of the convex part and at least partially covering the at least one convex part.

2. The display substrate according to claim 1, further comprising:
   a protection part between the convex part and the reflection part; wherein an orthographic projection of the protection part on the base substrate fully covers an orthographic projection of the convex part on the base substrate.

3. The display substrate according to claim 1, wherein the overflow detection structure further comprises: a refraction part disposed on the reflection part; and an orthographic projection of the refraction part on the base substrate fully covers an orthographic projection of the at least one convex part on the base substrate.

4. The display substrate according to claim 3, wherein the overflow detection structure further comprises: a blocking dam disposed on the refraction part; and
an orthographic projection of the blocking dam on the base substrate is located within the orthographic projection of the refraction part on the base substrate.

5. The display substrate according to claim 4, wherein the encapsulation dam comprises a first encapsulation dam and a second encapsulation dam;
the first encapsulation dam surrounds the second encapsulation dam;
the first encapsulation dam has a first side facing to the second encapsulation dam;
the second encapsulation dam has a second side facing away from the first encapsulation dam; and
the overflow detection structure is located between the first side and the second side.

6. The display substrate according to claim 5, wherein the overflow detection structure acts as the second encapsulation dam.

7. The display substrate according to claim 5, wherein the overflow detection structure is located between the first encapsulation dam and the second encapsulation dam.

8. The display substrate according to claim 5, further comprising:
a source-drain metal layer between a layer where the first encapsulation dam is located and the base substrate; and
a planarization layer, an anode layer, a pixel defining layer and a spacer layer which are disposed on one side, facing away from the base substrate, of the source-drain metal layer, wherein
the first encapsulation dam comprises:
a first encapsulation part in the planarization layer;
a second encapsulation part in the pixel defining layer; and
a third encapsulation part in the spacer layer.

9. The display substrate according to claim 8, wherein
the convex part is disposed on the planarization layer;
the reflection part is disposed on the anode layer;
one end of the reflection part extends between the first encapsulation part and the second encapsulation part, and other end of the reflection part extends along a direction of ascending distance from the first encapsulation dam; and
the refraction part is in the pixel defining layer, and the blocking dam is in the spacer layer.

10. The display substrate according to claim 8, wherein the second encapsulation dam comprises a fourth encapsulation part in the pixel defining layer, and a fifth encapsulation part in the spacer layer.

11. The display substrate according to claim 8, wherein the source-drain metal layer comprises: a low-level signal line located in a frame region; and
one end of the low-level signal line is covered with the first encapsulation part, and other end of the low-level signal line is electrically connected with the reflection part.

12. The display substrate according to claim 8, further comprising:
a cathode line on one side, facing away from the base substrate, of the spacer layer, wherein the cathode line is electrically connected with the reflection part.

13. The display substrate according to claim 1, wherein the encapsulation dam comprises a first encapsulation dam and a second encapsulation dam;
the first encapsulation dam surrounds the second encapsulation dam;
the first encapsulation dam has a first side facing to the second encapsulation dam;
the second encapsulation dam has a second side facing away from the first encapsulation dam; and
the overflow detection structure is located between the first side and the second side.

14. The display substrate according to claim 13, wherein the overflow detection structure is located between the first encapsulation dam and the second encapsulation dam.

15. The display substrate according to claim 13, further comprising:
a source-drain metal layer between a layer where the first encapsulation dam is located and the base substrate; and
a planarization layer, an anode layer, a pixel defining layer and a spacer layer which are disposed on one side, facing away from the base substrate, of the source-drain metal layer, wherein
the first encapsulation dam comprises:
a first encapsulation part in the planarization layer;
a second encapsulation part in the pixel defining layer; and
a third encapsulation part in the spacer layer.

16. The display substrate according to claim 15, wherein
the convex part is disposed on the planarization layer;
the reflection part is disposed on the anode layer;
one end of the reflection part extends between the first encapsulation part and the second encapsulation part, and other end of the reflection part extends along a direction of ascending distance from the first encapsulation dam; and
the refraction part is in the pixel defining layer, and the blocking dam is in the spacer layer.

17. The display substrate according to claim 15, wherein the second encapsulation dam comprises a fourth encapsulation part in the pixel defining layer, and a fifth encapsulation part in the spacer layer.

18. A display apparatus, comprising the display substrate according to claim 1.

19. A display substrate, comprising:
a base substrate, comprising a display region and a non-display region;
an encapsulation dam, disposed on the base substrate and located in the non-display region, and annularly surrounding the display region; and
an overflow detection structure, disposed on the base substrate and located in the non-display region, and annularly surrounding the display region, wherein the overflow detection structure is located between a region where the encapsulation dam is located and the display region;
wherein the overflow detection structure comprises:
at least two convex parts annularly surrounding the display region respectively; and
a reflection part on a side, facing away from the base substrate, of the convex part, wherein the reflection part at least partially covers the at least two convex part and at least fills a gap between the at least two convex parts.

20. A display substrate, comprising:
a base substrate, comprising a display region and a non-display region;

an encapsulation dam, disposed on the base substrate and located in the non-display region, and annularly surrounding the display region; and an overflow detection structure, disposed on the base substrate and located in the non-display region, and annularly surrounding the display region, wherein the overflow detection structure is located between a region where the encapsulation dam is located and the display region;

wherein the overflow detection structure comprises:
  at least one convex part; and
    a reflection part on a side, facing away from the base substrate, of the convex part and at least partially covering the at least one convex part;

wherein the encapsulation dam comprises a first encapsulation dam and a second encapsulation dam;
  the first encapsulation dam surrounds the second encapsulation dam;
  the first encapsulation dam has a first side facing to the second encapsulation dam;
  the second encapsulation dam has a second side facing away from the first encapsulation dam; and
  the overflow detection structure is located between the first side and the second side;

wherein the display substrate further comprises:
  a source-drain metal layer between a layer where the first encapsulation dam is located and the base substrate;
  a planarization layer, an anode layer, a pixel defining layer and a spacer layer which are disposed on one side, facing away from the base substrate, of the source-drain metal layer; and
  a buffer layer, a gate insulating layer and an interlayer dielectric layer which are sequentially disposed on a side, facing the source-drain metal layer, of the base substrate;

wherein the planarization layer further comprises: a crack barrier dam surrounding the first encapsulation dam, and part of the crack barrier dam is at least embedded in one of the buffer layer, the gate insulating layer or the interlayer dielectric layer.

* * * * *